United States Patent
Lee et al.

(10) Patent No.: US 6,491,889 B2
(45) Date of Patent: Dec. 10, 2002

(54) FERROELECTRIC SINGLE CRYSTAL WAFER AND PROCESS FOR THE PREPARATION THEREOF

(75) Inventors: Sang-Goo Lee, Siheung-si (KR); Sung-Min Rhim, Seongnam-si (KR); Min-Chan Kim, Cheju-si (KR)

(73) Assignee: Ibule Photonics Co., Ltd. (KR)

( * ) Notice: Subject to any disclaimer, the term of this patent is extended or adjusted under 35 U.S.C. 154(b) by 208 days.

(21) Appl. No.: 09/823,577

(22) Filed: Mar. 30, 2001

(65) Prior Publication Data

US 2001/0035123 A1 Nov. 1, 2001

(30) Foreign Application Priority Data

Apr. 3, 2000 (KR) .......................... 2000-17243
Nov. 21, 2000 (KR) .......................... 2000-69311

(51) Int. Cl.$^7$ ............................... C01B 33/26
(52) U.S. Cl. ..................... 423/328.2; 117/1; 117/2; 117/3
(58) Field of Search .................. 423/328.2; 117/1, 117/2, 3

(56) References Cited

U.S. PATENT DOCUMENTS 5,717,157 A * 2/1998 Tomozawa et al. ...... 136/236.1
5,998,910 A * 12/1999 Park et al. .................. 310/358

* cited by examiner

*Primary Examiner*—Felisa Hiteshew
(74) *Attorney, Agent, or Firm*—Anderson Kill & Olick, PC

(57) ABSTRACT

A ferroelectric single crystal having the composition of formula (I) has a high Piezoelectric constant together with good electromechanical and electrooptical properties and it can be prepared in a size of 5 cm in diameter or greater, useful for preparing various devices: $x(A)y(B)z(C)\text{-}p(P)n(N)$; (I) wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range fo 0.01 to 0.34, z is a number in the range of 0.01 to 0.1, and p and n are each independently a number in the range of 0.01 to 5.

9 Claims, 1 Drawing Sheet

FERROELECTRIC SINGLE CRYSTAL WAFER AND PROCESS FOR THE PREPARATION THEREOF

FIELD OF THE INVENTION

The present invention relates to a novel ferroelectric commercial size single crystal wafer having a high dielectric constant together with high electromechanical and electrooptical properties and a process for the preparation thereof.

BACKGROUND OF THE INVENTION

Single crystals having a high ferroelectric constant and small temperature dependency are particularly useful for preparing such devices as ultrasonicators, actuators, microphones, surface acoustic wave(SAW) elements, optical modulators and optical switches.

Since G. A. Smolenskii et al. reported that a single crystal of lead magnesium niobate ($Pb(Mg_{1/3}Nb_{2/3})O_3$; "PMN") is such a strongly ferroelectric material in *Sov. Phys. Solid State Vol.* 1, 1429 (1959), many processes for the preparation of PMN have been reported. Recently, Sang-goo Lee et al. has succeeded in growing PMN to a size of about 1 cm (see *Appl. Letts. Vol.* 74, No. 7, 1030 (1999)) using the Bridgemann method, and Luo has reported the growth and the properties of a PMN-PT ($0.67Pb(Mg_{1/3}Nb_{2/3})O_3$-$0.33PbTiO_3$) single crystal having a diameter of 2.5 cm in 1999 IEEE Ultrasonic Symposium-1009.

In order for a single crystal to possess a commercial value, it should be grown to a size of greater than 5 cm in diameter. However, ferroelectric single crystals have not been successfully grown to such a large size.

Therefore, there has existed a need to develop a strongly ferroelectric single crystal which can be grown to a size greater than 5 cm in diameter.

SUMMARY OF THE INVENTION

It is, therefore, a primary object of the invention to provide a novel ferroelectric single crystal wafer of a commercializable size having a high dielectric constant together with good electromechanical and electro-optical properties.

In accordance with an aspect of the present invention, there is provided a ferroelectric single crystal wafer having the composition of formula (I):

$$x(A)y(B)z(C)\text{-}p(P)n(N) \qquad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.0 1 to 0. 1, and p and n are each independently a number in the range of 0.01 to 5.

In accordance with another aspect of the present invention, there is provided a process for preparing the ferroelectric single crystal wafer having the composition of formula (I), which comprise the steps of:

(a) mixing a component selected from $Pb(Mg_{1/3}Nb_{2/3})O_3$ and $Pb(Zn_{1/3}Nb_{2/3})O_3$ with $PbTiO_3$, and $LiTaO_3$, in relative molar amounts ranging from 0.65 to 0.98, 0.01 to 0.34 and 0.01 to 0.1, respectively, (b) adding, to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, (c) calcining the mixture obtained in (b), followed by pulverizing the calcination product, (d) melting the powder obtained in (c), and (e) cooling the melt to crystallize.

BRIEF DESCRIPTION OF THE DRAWINGS

The above and other objects and features of the present invention will become apparent from the following description thereof, when taken in conjunction with the accompanying drawings wherein.

DETAILED DESCRIPTION OF THE INVENTION

Figure 1:
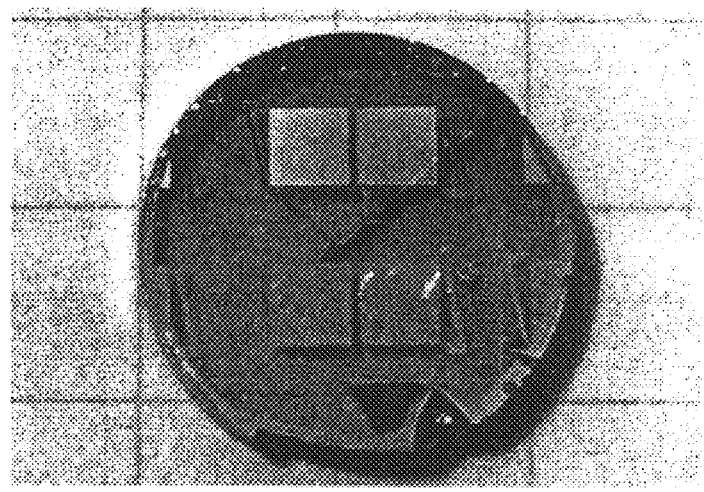
FIG. 1 is a photograph of a surface acoustic wave filter fabricated using a ferroelectric single crystal wafer prepared in Example according to the present invention.

The ferroelectric single crystal wafer having the composition of formula (I) according to the present invention is a novel, homogeneous single crystal material and it may be prepared by a solid phase reaction followed by melting-crystallization.

Specifically, in the solid phase reaction step, $Pb(Mg_{1/3}Nb_{2/3})O_3$ or $Pb(Zn_{1/3}Nb_{2/3})O_3$ is mixed with $PbTiO_3$ and $LiTaO_3$ in relative molar amounts ranging from 0.65 to 0.98, 0.01 to 0.34 and 0.01 to 0.1, respectively. Thereafter, to the resulting mixture, a metal selected from the group consisting of Pt, Au, Ag, Pd and Rh, and an oxide of a metal selected from the group consisting of Ni, Co, Fe, Sr, Sc, Ru, Cu and Cd are added in amounts ranging from 0.01 to 5% by weight based on the resulting mixture.

Subsequently, the resulting mixture was triturated in an organic solvent such as ethanol and isopropanol, dried at a temperature of 150 to 200°C., and calcined at a temperature of 850 to 1,000°C. for 1 to 10 hours.

The material thus obtained in the form of a ceramic powder is subjected to a post melting-crystallization step.

In the melting-crystallization step, the ceramic powder is allowed to melt at a high temperature of 1,300 to 1,500°C. under a pressure of 20 to 200 psi, and the melt is slowly cooled to room temperature over a period of 80 to 120 hours, rendering it to crystallize. The material obtained in this step is a single crystal having a homogeneous composition and its physicochemical characteristics are different from those of the ceramic powder obtained in the above solid phase reaction.

In accordance with the present invention, the size of the single crystal obtained may be controlled by adjusting the diameter of the vessel used for growing the single crystal. The vessel may be a crucible made of Pt, a Pt/Rh alloy or Ir and preferably having a diameter of 5 cm or greater. Therefore, the single crystal prepared by the above procedure may has a diameter of 5 cm or greater.

The single crystal thus prepared may be processed by a conventional manner to form the inventive ferroelectric single crystal wafer.

The inventive ferroelectric single crystal wafer has a transparency of 60% or more, a dielectric constant of about 5,500 or higher, a piezoelectric constant of about 1,500 pC/N or higher and an electrooptical coupling coefficient of about 50–100 pm/v, and therefore, may be beneficially used in various devices including ultrasonicators, actuators, microphones, surface acoustic wave(SAW) elements, optical modulators and optical switches. For example, the SAW filter exhibits a low insertion loss of 2 dB at a high frequency of 100 MHz or more.

The following Examples are given for the purpose of illustration only and are not intended to limit the scope of the invention.

EXAMPLE

Preparation of Single Crystal Wafers

Raw materials as listed in Table 1 were metered and mixed, and the resulting mixture was triturated in an ethanol medium using a 0.5" zirconia ball mill. Subsequently, the resulting mixture was dried at about 150° C. in a controlled electric furnace, and calcined at about 920° C. for 6 hours in a capped alumina crucible.

The material thus obtained was pulverized with a ball mill. The powder was charged in a Pt crucible, and the crucible was covered and placed in a high temperature crystal growth furnace (1500° C., 100 psi) for 20 hours to melt the powder completely. The melt was cooled slowly to 20° C. over 120 hours to obtain a semi-transparent, homogeneous single crystal having a diameter of about 5 cm.

The single crystals thus obtained were polished to form a wafer having a thickness of 0.5mm.

applied thereto at 120° C. for 30 minutes, thus polarizing it, and the electromechanical coupling coefficient ($k_{33}$) and the piezoelectric constant ($d_{33}$) in a polarization direction vibration mode were calculated by a resonance or semi-resonance method. The $k_{33}$ value shows an efficiency for converting an electric energy to a mechanical energy when an electric field was applied, and the $d_{33}$ value is a yardstick of potential amount ($D_3$) generated in an axial direction when a given strain or tensile stress is applied in the axial direction.

The results of such measurements conducted for the inventive as well as commercial single crystals are shown in Table 2.

TABLE 2

|  | PZT-5A | PZT-5H | Motorola 3203 HD | PZN-PT | MPN (Material 1 of Example) |
|---|---|---|---|---|---|
| Dielectric Constant | 1,700 | 3,400 | 3,800 | 5,000 | 5,500 |
| Dielectric Loss | 0.02 | 0.02 | 0.02 | 0.014 | 0.006 |
| $d_{33}$ (pC/N) | 374 | 593 | 650 | 2,000 | 2,500 |
| $k_{33}$ | 0.71 | 0.75 | 0.75 | 0.91 | 0.92 |

Incorporated in Table 2 are the data for the commercially available single crystals reported in the literature [K. H. Hellwege et al., "Numerical Data and Functional Relationships in Science and Technology", pp 125, Spring-Verlag Berlin NY 1981; and Ronald E. Mckeighen, "Design Guideline for Medical Ultrasonic Arrays": presented at the SPIE International Symposium on Medical Imaging, San Diego, CA, 1998].

In addition, the electro-optical property of the inventive single crystal water prepared in Example were measured in accordance with the method disclosed by Fernando Agullo-Lopez et al. [Electrooptics, pp 49, Academic Press, 1994]. The electro-optical coupling coefficients thus measured were about 50–100 pm/v, which are about twice the values

TABLE 1

| Raw materials | x(A) | Y(B) | Z(C) | p(P) | n(N) | Composition Formula |
|---|---|---|---|---|---|---|
| Material 1 | $Pb(Mg_{1/3}Nb_{2/3})O_3$ 0.8 mol | $PbTiO_3$ 0.18 mol | $LiTaO_3$ 0.02 mol | Pt 1 wt % | NiO 1 wt % | MPN |
| Material 2 | $Pb(Mg_{1/3}Nb_{2/3})O_3$ 0.8 mol | $PbTiO_3$ 0.18 mol | $LiTaO_3$ 0.02 mol | Ag 1 wt % | NiO 1 wt % | MAN |
| Material 3 | $Pb(Zn_{1/3}Nb_{2/3})O_3$ 0.89 mol | $PbTiO_3$ 0.09 mol | $LiTaO_3$ 0.02 mol | Pt 1 wt % | NiO 1 wt % | ZPN |
| Material 4 | $Pb(Zn_{1/3}Nb_{2/3})O_3$ 0.89 mol | $PbTiO_3$ 0.09 mol | $LiTaO_3$ 0.02 mol | Ag 1 wt % | NiO 1 wt % | ZAN |

Footnote:
MPN: $0.8[Pb(Mg_{1/3}Nb_{2/3})O_3]0.18[PbTiO_3]0.02[LiTaO_3]$—$1[Pt]1[NiO]$
MAN: $0.8[Pb(Mg_{1/3}Nb_{2/3})O_3]0.18[PbTiO_3]0.02[LiTaO_3]$—$1[Ag]1[NiO]$
ZPN: $0.8[Pb(Zn_{1/3}Nb_{2/3})O_3]0.18[PbTiO_3]0.02[LiTaO_3]$—$1[Pt]1[NiO]$
ZAN: $0.8[Pb(Zn_{1/3}Nb_{2/3})O_3]0.18[PbTiO_3]0.02[LiTaO_3]$—$1[Ag]1[NiO]$ Measurement of the Properties Each of the single crystal wafers thus prepared was cleaned with an ultrasonic cleaner and a 15 mm×15 mm chrome(Cr) electrode was formed on each surface of the wafer by a DC(direct current) magnetron sputter (Model KVSC T5050, a product of Korea Vacuum Science). The capacitance and the dissipation of the single crystal wafer were measured at 1 KHz, 0.5 $V_{rms}$ using HP 4192A LF impedance analyzer (a product of Hewlett-Packard Co.) and the dielectric constant and the dielectric loss were calculated from the measured values.

Further, in order to evaluate the piezoelectric property of the single crystal wafer, an electric field of 3 kV/cm was for lithium niobate or lithium tantalite, i.e., about 30–50 pm/v.

Preparation of a Surface Acoustic Wave (SAW) Filter Using the Inventive Single Crystal Wafer A SAW filter was prepared using the single crystal wafer prepared in Example, as follows.

The surface of a wafer of Material 1 prepared in Example was cleaned with a 5:95 mixture of DECONEX(a product of Borer Chemi) and deionized water in an ultrasonic cleaner at 40° C. for 20 minutes, rinsed and cleaned again by a conventional semiconductor surface cleaning process.

On the surface of the single crystal wafer, an aluminum alloy (Al-0.5% Cu) was deposited at a thickness of about 1,000 Å by a sputtering method, and subsequently, a photoresist was spin-coated thereon at a thickness of about 1 μm. After a photomask having a desired electrode pattern was placed on the photoresist layer, the resulting assembly was exposed to UV light. The exposed photoresist layer was developed by a suitable developing solution and processed to obtain a fixed photoresist layer having the shape of the electrode pattern, and the exposed Al alloy layer was etched using a mixture of phosphoric acid, nitric acid and acetic acid. Finally, the photoresist layer covering the patterned Al alloy layer was removed using a suitable solution. The spacing between two IDT fingers of the SAW filter prepared as above was 40 μm. FIG. 1 is a photograph of the SAW filter thus prepared.

Figure 2:
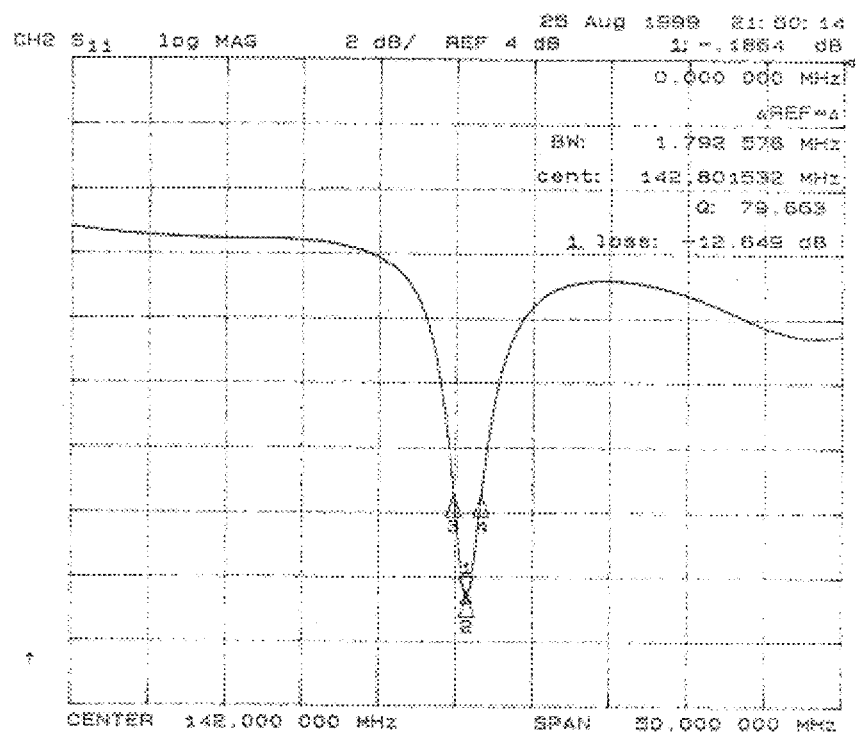
FIG. 2 shows the reflection characteristics of the surface acoustic wave filter of FIG. 1.

The reflection characteristics of the SAW filter were measured using a network analyzer with on-wafer probe. As can be seen from FIG. 2, the center frequency of the SAW filter is 142 MHz, and therefore, the propagation velocity of the surface acoustic wave thereof is 5,840 m/sec, which is higher than those of conventional SAW filters.

Accordingly, it is clear that the single crystal wafer having the composition of formula (I) according to the present invention can be beneficially used as a substrate in preparing a SAW filter for the next generation mobile telecommunication such as IMT(international mobile telecommunication)-2000 for which the spacing between the two fingers of IDT is designed to be about 2.8 μm.

While the invention has been described in connection with the above specific embodiments, it should be recognized that various modifications and changes may be made to the invention by those skilled in the art without departing from the scope of the invention as defined by the appended claims.

What is claimed is:

1. A ferroelectric single crystal wafer having the composition of formula (I):

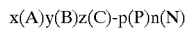

$$x(A)y(B)z(C)\text{-}p(P)n(N) \quad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

2. The single crystal wafer of claim 1, which has a diamer of greater than 5 cm.

3. The single crystal wafer of claim 1, which has a dielectric constant of 5,000 or higher.

4. A process for the single crystal wafer having the composition of formula (I) according to claim 1, which comprises the steps of (a) mixing one component selected from $Pb(Mg_{1/3}Nb_{2/3})O_3$ and $Pb(Zn_{1/3}Nb_{2/3})O_3$ with $PbTiO_3$ and $LiTaO_3$, in relative molar amounts ranging from 0.65 to 0.98, 0.01 to 0.34 and 0.01 to 0.1, respectively, (b) adding, to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, (c) calcining the mixture obtained in (b), followed by pulverizing the calcination product, (d) melting the powder obtained in (c), and (e) cooling the melt to crystallize.

5. The process of claim 4, wherein the calcination step is conducted at a temperature of 850 to 1,000 ° C. for 1 to 10 hours.

6. The process of claim 4, wherein the melting step is conducted at a temperature of 1,300 to 1,500° C. under a pressure of 20 to 200 psi.

7. The process of claim 4, wherein the cooling step is conducted by slowly cooling the melt to room temperature over a period of 80 to 120 hours.

8. The process of claim 4, wherein the melting and cooling steps are conducted in a crucible made of Pt, a Pt/Rh alloy or Ir.

9. The process of claim 8, wherein the crucible has a diamer of greater than 5 cm.

* * * * *